United States Patent [19]

Lou

[11] 4,115,710

[45] Sep. 19, 1978

[54] SUBSTRATE BIAS FOR MOS INTEGRATED CIRCUIT

[75] Inventor: Perry W. Lou, Houston, Tex.

[73] Assignee: Texas Instruments Incorporated, Dallas, Tex.

[21] Appl. No.: 754,474

[22] Filed: Dec. 27, 1976

[51] Int. Cl.$^2$ .................. H03K 1/02; H03K 3/353
[52] U.S. Cl. .................. 307/304; 307/200 B; 307/297
[58] Field of Search .................. 307/251, 200 B, 296, 307/297, 304, DIG. 4

[56] References Cited

U.S. PATENT DOCUMENTS

| | | | |
|---|---|---|---|
| 3,609,414 | 9/1971 | Pleshko et al. | 307/304 X |
| 3,794,862 | 2/1974 | Jenne | 307/296 X |
| 3,806,741 | 4/1974 | Smith | 307/304 |
| 3,970,875 | 7/1976 | Leehan | 307/297 X |
| 4,016,434 | 4/1977 | DeFilippi | 307/297 |

FOREIGN PATENT DOCUMENTS 2,601,566 7/1976 Fed. Rep. of Germany ........... 307/304

OTHER PUBLICATIONS

Hummel, "Sentry Circuit for Substrate Voltage Control", *IBM Tech. Discl. Bull.;* vol. 15, No. 2, pp. 478–479; 7/1972.
Frantz, "Threshold Voltage Control for N-Channel MOSFET Devices"; *IBM Tech. Discl. Bull.;* vol. 12, No. 12, p. 2078; 5/1970.
Blaser et al., "Substrate and Load Voltage Compensation", 1976 *IEEE Int'l. Solid-State Circuits Conf.;* pp. 56–57; 2/1976.
Chang, "FET N-Channel Threshold-Voltage-Control Circuit"; *IBM Tech. Discl. Bull.;* vol. 17, No. 1, p. 140; 6/1974.
Kubo et al., "A Threshold Voltage Controlling Circuit for Short Channel MOS Circuits", 1976 *IEEE Int'l Solid-State Circuit Conf.;* pp. 54–55; 2/1976.
Sonoda, "Active Decoupling Circuit", *IBM Tech. Discl. Bull.;* vol. 17, No. 5, p. 1369; 10/1974.
Frantz et al., "MOSFET Substrate Bias-Voltage Generator"; IBM Tech. Discl. Bull., vol. 11, No. 10, p. 1219; 3/1969.

*Primary Examiner*—Larry N. Anagnos
*Attorney, Agent, or Firm*—James T. Comfort; John G. Graham

[57] ABSTRACT

A charge pump circuit for generating a substrate bias for MOS/LSI integrated circuit chips is provided, preferably for P-channel integrated circuits. The charge pump circuit includes an oscillator producing a square wave which is applied to a reference circuit that is also responsive to a threshold voltage Vt monitor. The reference circuit applies to a pump diode a square wave having a level responsive to the supply and thresholds. A zero voltage drop source follower connects the square wave to the diode to avoid loading. The threshold monitor forces the square wave to a high level when the threshold is below a certain value.

3 Claims, 17 Drawing Figures

Source Follower
$V3 \cong V3' = V_r + V_t$

Substrate Capacitance to $V_{ss}$ & $V_{dd}$
$V2(0) = 0$

SUBSTRATE BIAS FOR MOS INTEGRATED CIRCUIT

BACKGROUND OF THE INVENTION

This invention relates to MOS integrated circuits of the type having substrate bias and more particularly to a circuit for generating a substrate bias voltage in a P-channel MOS/LSI device.

In P-channel MOS integrated circuits, some circuit functions such as dynamic shift registers produce an undesirable phenomena referred to as charge pumping. A P-N junction in the shift register may become forward biased and inject holes into the substrate, which will spread for a distance related to the lifetime of holes in n-type silicon. Other devices within this distance may be rendered inoperative by this charge spreading. Memory cell such as shift register stages, or self-refresh RAM cells are particularly vulnerable. Forward bias of the P-N junction may be avoided by adding a substrate bias, i.e., biasing the substrate positive with respect to the "Vss" terminal to which many of the sources of MOS transistors in the MOS/LSI device are connected. It is preferable to avoid adding terminals to the MOS/LSI package because there are industry-standard dual-in-line packages which have 18 pins, 22 pins or 28 pins, etc. and great economies are achieved by using a standard package with the smallest number of pins. Further, if the MOS device is to be used as a calculator chip or in other small self-contained housings, additional power supplies are to be avoided. A calculator should operate on a single 9 v. battery for lowest cost. For these reasons, a substrate bias supply internal to the chip is the objective. N-channel memory devices have been reported which have internally-generated substrate bias features; the circuits previously proposed for N-channel memory chips are not suitable for P-channel calculator chips, however. The purpose of the N-channel substrate bias is to increase the threshold voltage of parasitic MOS transistors, i.e., to avoid unwanted MOS transistors being created under field oxide. Substrate bias has very pronounced effect on threshold voltage, whether in N-channel or P-channel. The substrate bias can change as the Vdd supply battery discharges or due to temperature variations and alter the threshold voltages throughout the MOS/LSI device.

It is therefore the principal object of the invention to provide an improved circuit for generating substrate bias for a semiconductor integrated circuit device. Another object is to provide a substrate bias supply circuit internal to a P-channel MOS/LSI device.

SUMMARY OF THE INVENTION

In accordance with an embodiment of the invention, a charge pump circuit for generating a substrate bias for MOS/LSI integrated circuit chips is provided, preferably for P-channel integrated circuits. The charge pump circuit includes an oscillator producing a square wave which is applied to a reference circuit that is also responsive to a threshold voltage Vt monitor. The reference circuit applies to a pump diode a square wave having a level responsive to the supply and thresholds. A zero voltage drop source follower couples the square wave to the diode through a pump capacitor. The threshold monitor forces the square wave to a high level when the threshold is below a certain value.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

Figure 3:
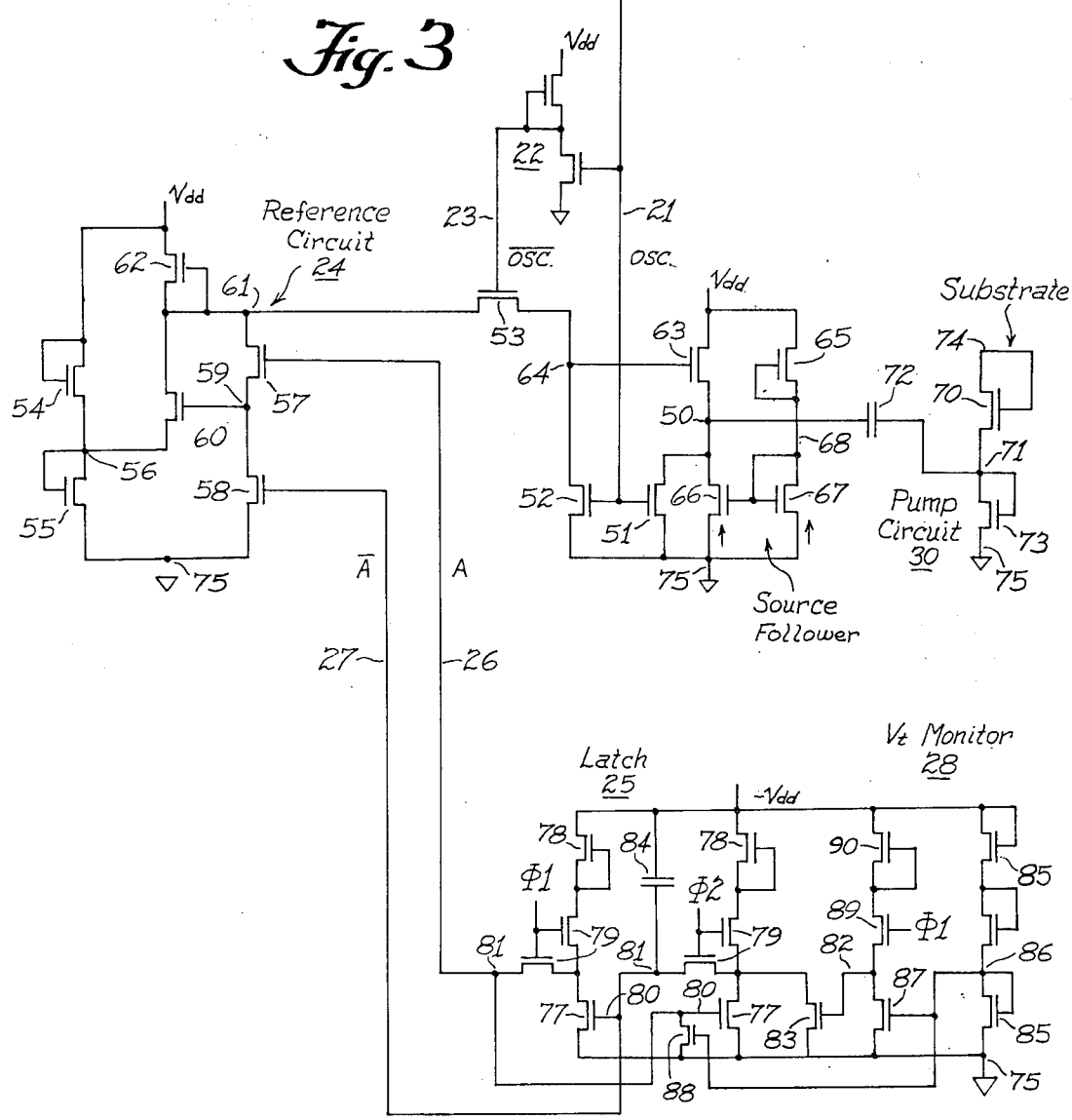
FIG. 3 is an electrical schematic diagram of the substrate pump of FIG. 1.
Figure 4:
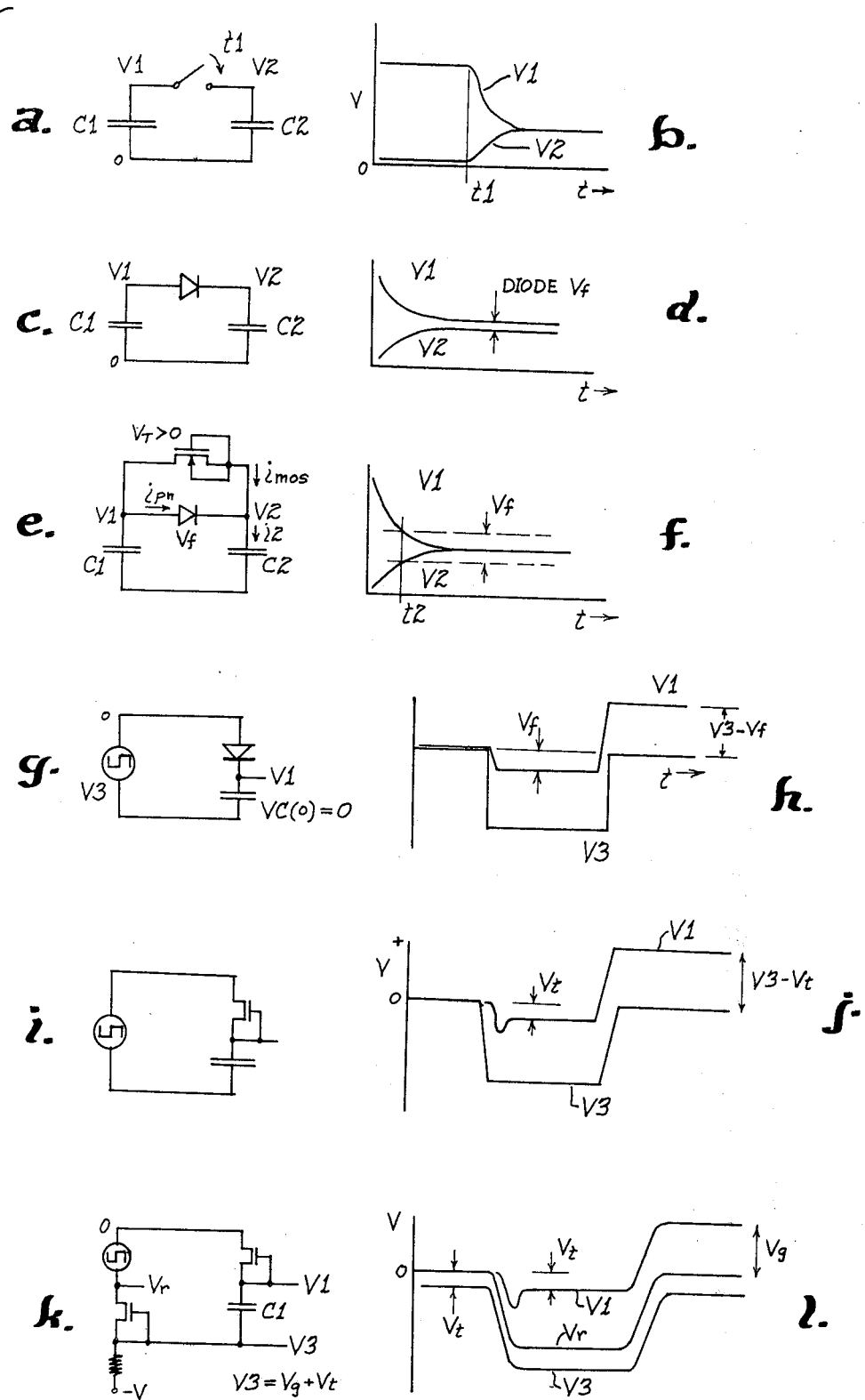
Figure 4M:
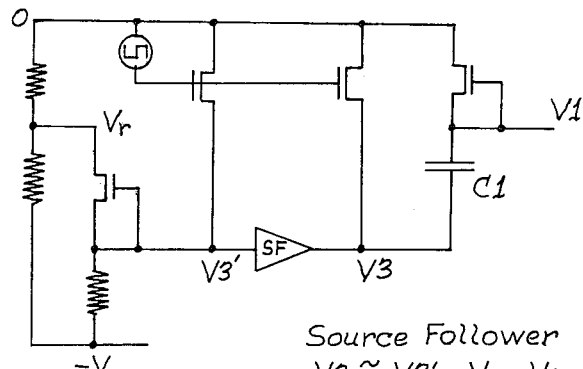
Figure 4N:
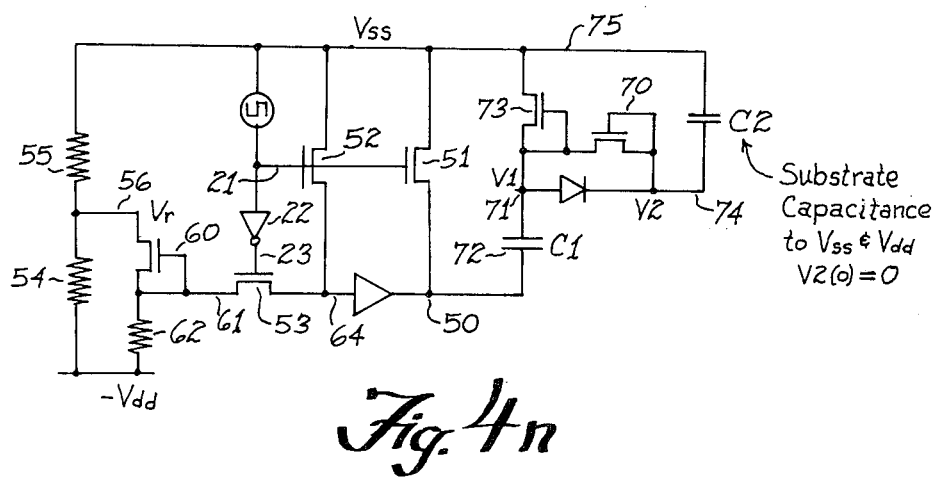

FIGS. 4(a)-4(n) explain the operation of the charge pump of FIG. 3.

DETAILED DESCRIPTION OF SPECIFIC EMBODIMENT

Figure 1:
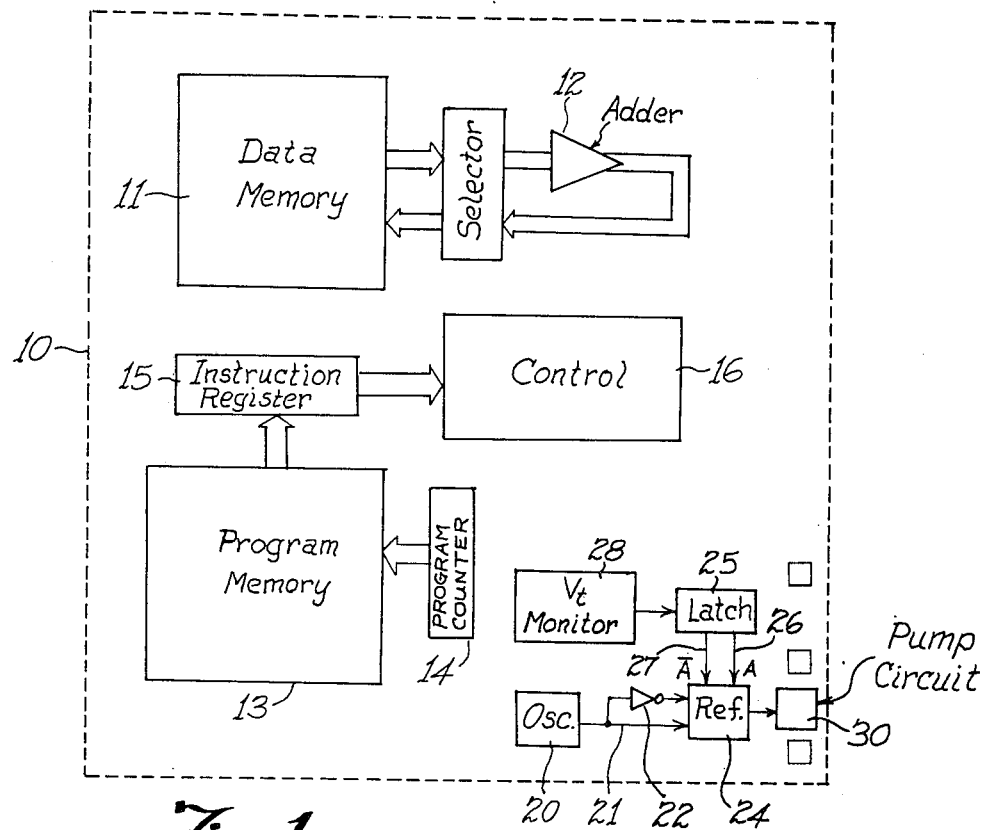
FIG. 1 is a block diagram of a semiconductor chip or substrate containing a calculator or microprocessor system and using the substrate pump of the invention.
Figure 2:
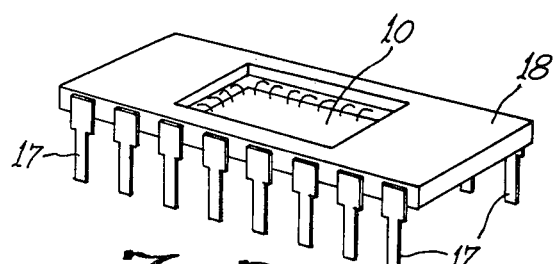
FIG. 2 is a pictorial view of a semiconductor device package containing the substrate of FIG. 1.

With reference to FIG. 1, an MOS/LSI device which may use the invention is shown. The device includes a semiconductor substrate 10 which may be 150 to 200 mils on a side, for example, and which contains a data memory 11, an arithmetic unit 12 and a ROM 13 for storing instruction words. An address register 14 defines an address for the ROM, and the accessed instruction word is loaded into an instruction register 15, from which it is applied to control decoder circuitry 16 to define the system operation. Data from the memory 11 is selectively applied to the input of the arithmetic unit 12 by selector logic, and the output of the arithmetic unit is applied back to the memory by the selector logic, all under control of commands from the control decoder 16. Data and functional commands are input and output in a number of pins or terminals 17 as seen in FIG. 2, where the substrate 10 is shown mounted in a standard dual-in-line package 18. Bonding pads on the periphery of the chip or substrate 10 are connected to the terminals 17 by small wires ball-bonded to internal bond areas of the terminals. The device may be a calculator chip as set forth in copending applications Ser. No. 735,917 filed Oct. 27, 1976 by C. Y. Mar and M. J. Caruso, or Ser. No. 706,718, filed July 19, 1976 by Graham S. Tubbs, both assigned to Texas Instruments. Also, the device could be a microprocessor device used for any of a large number of different control applications for a wide variety of electrical appliances or digital equipment or the like.

Included on the chip or substrate 10, according to the invention, is a substrate pump circuit which basically consists of an oscillator 20 which produces a square wave on a line 21 and its complement, via an inverter 22, on a line 23. The frequency of this oscillation is perhaps 200 to 800 KHZ, although this is not critical. The square wave on the lines 21 and 23 is applied to a reference circuit 24 which also receives the output of a latch 25 on lines 26 and 27. The latch 25 represents the output of a Vt or threshold voltage monitor 28 and produces a voltage $\overline{A}$ when Vt is above a certain value or a voltage A when Vt is below such value. The reference circuit 24 applies a high level square wave to a pump device 30 which is basically a large diode. The location of the pump device 30 is at the edge of the substrate 10 near the bonding pads, too far from the memory 11 or arithmetic unit 12 or other parts of the system to create a charge spreading problem, even though the pumping phenomena is the same as would be undesirable in a dynamic shift register as may be used for the data memory 11.

Referring to FIG. 3, a schematic diagram of a pump circuit according to the invention is illustrated. The oscillator 20 is basically an RC feedback oscillator which has a Schmitt trigger input circuit made up of a depletion mode transistor 31 with gate shorted to source and a pair of enhancement mode transistors 32 and 33 whose gates are connected to receive a feedback signal on a line 34. When the voltage on the line 34 reaches a threshold level, the transistors 32 and 33 turn on, turning off transistors 35 and 36 and allowing the line 21 to go to Vss via depletion device 37, the transistors 36 and 37 acting as a source follower stage. This cuts off a transistor 38 and allows a node 39 to charge toward $-Vdd$ through a depletion mode transistor 40. The node 39 is clamped at a voltage less negative than $-Vdd$ by a pair of gate-shorted-to-drain enhancement transistors 41. A square wave exists on the node 39, and a ramp output is produced on an output node 42 by a depletion device 43, a capacitor 44 and a stage including an enhancement driver transistor 45 and a depletion load 46. These components function to integrate a source wave to produce a sawtooth. The frequency of the oscillator is determined by the RC time constant of the depletion device 43 and the capacitor 44. When the node 47 between these two reaches a level which cuts on the transistor 45, the node 42 discharges toward ground, and the devices 32 and 33 cut off in feedback path 34. This turns on transistors 36 and 38, grounds the node 39 and the node 47 begins to discharge toward Vss through the device 43 and the transistor 38. When the node 47 goes below the threshold of the transistor 45, this transistor cuts off and the node 42 begins to charge toward $-Vdd$ as the cycle repeats. The oscillator must be self-starting even when the substrate bias is zero, as occurs when the ON-OFF switch is turned on and $-Vdd$ is first applied.

The square wave oscillator output on the line 21 is applied also to the inverter 22 which consists of an enchancement driver transistor and a depletion load transistor, producing on the line 23 the complement of the oscillator output.

The reference circuit 24 produces an output square wave on a line 50 which is of the same frequency as the oscillator square wave on the lines 21 and 23. When the oscillator square wave or the line 21 is $-V$, a transistor 51 will cut on and the node 50 will be at Vss. Also, a transistor 52 will be cut on and the gate of a depletion device will be discharged to ground. At this time, a transistor 53 is kept cut off by the $\overline{OSC}$ output on the line 23 which is at Vss. So, during half the cycle, the node 50 is unconditionally grounded. It is during the half cycle when the oscillator output line 21 is at ground and the $\overline{OSC}$ output on line 23 is at $-V$ that the critical regulation occurs. A pair of gate-shorted-to-drain depletion mode devices 54 and 55 act as a voltage divider to produce a reference voltage at a node 56 of about $-3$ volts but this voltage is responsive to changes in Vdd. When the "A" voltage on the line 26 at the latch output is at $-V$ and the $\overline{A}$ voltage on the line 27 is at Vss, a transistor 57 is conductive and a transistor 58 is cut off, so a node 59 between them is high and a transistor 60 is conductive and adds a Vt drop. Thus, the voltage at a node 61 will be essentially determined by the node 56 voltage plus a Vt. A very small depletion mode device 62 functions when $\overline{A}$ is high to bring the node 61 to near $-Vdd$. The level of the node 61 is much lower than Vdd in the mode when $\overline{A}$ is low; however, there is some drop across the series device 53. The voltage on the gate of a depletion mode transistor 63 is essentially at a Vt more negative than the node 56. That is, $-3V$ minus one Vt.

The transistor 63 is the device of a zero voltage drop source follower stage as set forth in my U.S. Pat. No. 4,068,140, issued Jan. 10, 1978, and assigned to Texas Instruments. This stage functions to apply the same voltage to the node 50 as exists on a node 64 at the gate of the transistor 63; a pair of depletion mode transistors 63 and 65 of the same channel width are used along with a pair of enhancement mode transistors 66 and 67 of the same channel width. The ratio of channel lengths for the transistors 63 and 66 is the same as that for the transistors 65 and 67. The transistor 65 has its gate shorted to a node 68, as does transistor 67, so the transistor 65 is a constant current device and transistor 67 is in saturation with a drain current determined by the transistor 65. The current "i" through the transistors 65 and 67 will be the same as the current "i" through the transistors 63 and 66; the former acts as a current mirror. So long as the transistor 66 is in saturation, it can be shown that the voltage on the node 50 is the same as the voltage on the node 64, because the voltage on the gate of transistor 65 is the same as the voltage on the node 68.

The regulated square wave on the node 50 is applied to a pump device 30 primarily consisting of a large MOS capacitor 72. A node 71 which is a p-diffused region goes positive when the node 50 goes positive ($-V$ to 0), through the capacitor 72, and so the node 71 conducts to the substrate via the diffusion to substrate pn junction and also through the device 70. An MOS device 73 clamps the node 71 at $-(Vss+Vt)$ during the precharge cycle (when line 23 is negative and line 21 is at Vss). Note that the substrate is the node 74, and this node will be charged to a voltage such as $+3V$, more or less, with respect to the "ground" terminal 75 of all of the other circuitry on the chip. The ground terminal of the battery input to the system is thus not connected to the substrate 74 as in conventional devices.

The latch circuit 25 which generates the A and $\overline{A}$ voltages on the lines 26 and 27 consists of two identical circuits, one clocked on $\Phi1$ and one on $\Phi2$, each having a driver transistor 77, a depletion load 78, clocked devices 79, an input 80, and an output 81. The $\Phi1$ clock precedes the $\Phi2$ clock. The outputs 81 are cross coupled to the inputs 80 so a latch operation is provided. The output on the line 26 will be high in usual operation, unless the Vt monitor 28 detects a low Vt and produces a low voltage on a line 82 to the gate of a transistor 83; this will force the latch to switch states to the line 27 or $\overline{A}$ signal will go high and A will go low. A capacitor 84 initially charges the output 81 negative. It is noted that when power is initially turned on the threshold voltages of all of the enhancement devices on the chip are at near zero.

The threshold monitor 8 consists of a divider made of three depletion devices 85, each with gate shorted to drain. A voltage on a node 86 is a fixed fraction of $-Vdd$, about $-0.5$ v. This will, when thresholds are low, turn on transistors 87 and 88, or when thresholds are high tend to turn off these transistors. A transistor 89 gated on $\Phi1$ and a depletion load 90 are in series with the transistor 87.

Referring to FIGS. 4a–4n, the operation of the substrate pump will be explained. In FIG. 4a, when the switch closes at $t1$, C2 which represents the substrate charges to a value as seen in 4b. If a diode is substituted for the switch or placed in series with the switch as in 4c, then the final voltage will show a separation $Vf$ as seen in 4d, the $Vf$ separation is eliminated as seen in 4f. Here, when $t<t2$, $i2 = ipn + i$ mos, and when $t>t2$, $i2 \approx i$ mos, since $V1-V2 < Vf$ and $ipn \approx 0$. If, in 4e, at $t=0$, $V1 < V2$, then $ipn = i$ mos $\approx 0$ and $i2 \approx 0$; therefore $\Delta V2 = 0$. However, if at $t1$, $V1 > V2$ in 4e, then $\Delta V2 \neq 0$, indeed $\Delta V2(t > t1) = [V1(t1) - V2(t1)]C1/(C1+C2)$.

Consider the following sequence: (1) at $t=0$, $V1(0) = Vpc$ and $V2(0) = 0$; $Vpc$ is some dc value greater than zero and independent of time; (2) at $t1 > 0$, $V2(1) = Vpc[C1/C1+C2)]$; (3) at $t2t > t1$, $V1(2)$ is forced $< V2(1)$; $V2(2) = V2(1)$; further $VC1(2)$ is forced to equal $Vpc$ by some means; C1 and C2 do not share a common mode here; (4) at $t3 > t2$, $V1(3) = Vpc$ and $V1(3) > V2(2)$; (5) at $t4 > t3$, $V2(4) = V2(2) + \Delta V2$, or $V2(4) = V2(2) + [Vpc - V2(2)]C1/(C1+C2)$; (6) this proves repeats as from (3), thus incrementing the value of V2 each cycle until finally $V2 = Vpx$ so that $\Delta V2 = 0$.

The basic mechanism implemented in the pump circuit is illustrated in 4g with the diagram of 4h. With an MOS device instead of the $pn$ diode, the mechanism is as in 4i with 4j. Adding the compensation for the $Vt$ drop (i.e., transistor 60), then the mechanism appears as in 4k with 4l. Now, with the voltage divider of transistors 54, 55 introduced, along with the shunt switching action of transistors 51 and 52, the circuit is as in 4m. When this is combined with 4e, the final configuration is as in 4n, where C2 is the substrate capacitance to $Vss$ and to $Vdd$, and $V2(0) = 0$.

If the transistor 60 in 4n is turned off (gate grounded), then V3 goes toward $-(Vdd - Vt)$, the $Vt$ drop being introduced by the transistor 53, where $(Vdd - Vt) > Vr + Vt$. Hence, at each cycle $\Delta V2$ is larger if transistor 60 is off since $(Vpc - V2(t-1))$ is a larger value. Also, the final value of the substrate C2 approaches $V3 - Vt = (Vdd - Vt) - Vt = Vdd - 2Vt$. Since $|Vt|$ increases as $Vbb$ increases, it is possible to monitor $Vt$, to a point, and then switch in transistor 60 as in FIG. 3, so that the final value of substrate bias $Vbb$ should be rather, $|Vr|$, under normal operating conditions.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A substrate pump circuit for a semiconductor integrated circuit, comprising diode means coupling a pump node to the substrate at a location on the chip removed from critical devices, generator means for producing a periodic voltage, the generator means having an output connected to the pump node and having an input responsive to the output of a reference circuit, the reference circuit having means responsive to the supply voltage level, and means responsive to threshold voltage for changing the output of the generator means from a high level voltage when the threshold is low to a regulated voltage when the threshold voltage is above a given magnitude.

2. A circuit according to claim 1 wherein the generator means includes an oscillator of the frequency of the periodic voltage, the output of the oscillator and its complement being connected to control devices in series with and in parallel to the output of the reference circuit.

3. A circuit according to claim 1 wherein the regulated voltage is responsive to supply voltage.

* * * * *